United States Patent
Huang et al.

(10) Patent No.: US 10,693,102 B2
(45) Date of Patent: Jun. 23, 2020

(54) LIGHT EMITTING DEVICE AND TRANSPARENT ELECTRODE THEREOF, AND TRANSPARENT LIGHT EMITTING DEVICE HAVING A LIGHT-TRANSMITTING AREA AND A LIGHT-OPAQUE AREA

(71) Applicants: Industrial Technology Research Institute, Hsinchu (TW); Intellectual Property Innovation Corporation, Hsinchu (TW)

(72) Inventors: Yi-Hsiang Huang, Changhua County (TW); Kuan-Ting Chen, Yunlin County (TW); Yu-Tang Tsai, New Taipei (TW); Yu-Hsiang Tsai, Hsinchu County (TW); Wei-Lung Tsai, Tainan (TW); Yu-Yu Ho, Yunlin County (TW)

(73) Assignees: Industrial Technology Research Institute, Hsinchu (TW); Intellectual Property Innovation Corporation, Hsinchu (TW)

( * ) Notice: Subject to any disclaimer, the term of this patent is extended or adjusted under 35 U.S.C. 154(b) by 0 days.

(21) Appl. No.: 15/847,926

(22) Filed: Dec. 20, 2017

(65) Prior Publication Data

US 2019/0088900 A1 Mar. 21, 2019

(30) Foreign Application Priority Data

Sep. 15, 2017 (TW) .............................. 106131667 A (51) Int. Cl.
*H01L 51/52* (2006.01)
*H01L 51/50* (2006.01)
*H01L 27/32* (2006.01)

(52) U.S. Cl.
CPC ........ *H01L 51/5234* (2013.01); *H01L 27/326* (2013.01); *H01L 27/3209* (2013.01);
(Continued)

(58) Field of Classification Search
CPC ............. H01L 51/5012; H01L 51/5092; H01L 51/5234; H01L 27/3209; H01L 51/5088
See application file for complete search history.

(56) References Cited

U.S. PATENT DOCUMENTS 6,639,357 B1 10/2003 Parthasarathy et al.
7,321,196 B2 1/2008 Cheng et al.
(Continued)

FOREIGN PATENT DOCUMENTS

CN 102290531 12/2011
TW 200906218 2/2009
(Continued)

OTHER PUBLICATIONS

Kihyon Hong, et al., "Optical Properties of WO3/Ag/WO3 Multilayer As Transparent Cathode in Top-Emitting Organic Light Emitting Diodes," The Journal of Physical Chemistry C, 2011, 115(8), Feb. 3, 2011 pp. 3453-3459.
(Continued)

*Primary Examiner* — Quoc D Hoang
(74) *Attorney, Agent, or Firm* — JCIPRNET (57) ABSTRACT

A light emitting device and a transparent electrode thereof are provided in which the transparent electrode includes a transparent conducting layer and an injection layer. The injection layer is disposed between the transparent conducting layer and a light emitting layer of the light emitting device, wherein a material of the injection layer is a metal-doped alkali metal salt or a metal-doped metal oxide.

6 Claims, 8 Drawing Sheets

(52) U.S. Cl.
CPC ...... *H01L 27/3276* (2013.01); *H01L 51/5012* (2013.01); *H01L 51/5088* (2013.01); *H01L 51/5092* (2013.01); *H01L 51/5206* (2013.01); *H01L 2251/305* (2013.01); *H01L 2251/306* (2013.01); *H01L 2251/308* (2013.01); *H01L 2251/558* (2013.01)

(56) References Cited

U.S. PATENT DOCUMENTS

| | | | |
|---|---|---|---|
| 9,112,168 | B2 | 8/2015 | Ishidai et al. |
| 9,608,214 | B2 * | 3/2017 | Lee ................. H01L 51/442 |
| 2013/0313542 | A1 * | 11/2013 | Hakii .................. C07D 213/79 257/40 |
| 2014/0204023 | A1 | 7/2014 | Kumar et al. |
| 2016/0163770 | A1 | 6/2016 | Kim et al. |
| 2017/0084572 | A1 | 3/2017 | Liu et al. |
| 2017/0222162 | A1 * | 8/2017 | Lee .................... H01L 51/0077 |

FOREIGN PATENT DOCUMENTS

| | | |
|---|---|---|
| TW | I308846 | 4/2009 |
| TW | 200948178 | 11/2009 |
| TW | I324496 | 5/2010 |
| TW | I384901 | 2/2013 |
| TW | I453967 | 9/2014 |

OTHER PUBLICATIONS

Jung Hyuk Im, et al., "Bulk-like Al/Ag bilayer film due to suppression of surface plasmon resonance for high transparent organic light emitting diodes," Organic Electronics, vol. 33, Mar. 19, 2016, pp. 116-120.

"Office Action of Taiwan Counterpart Application," dated Aug. 15, 2018, pp. 1-5.

* cited by examiner

LIGHT EMITTING DEVICE AND TRANSPARENT ELECTRODE THEREOF, AND TRANSPARENT LIGHT EMITTING DEVICE HAVING A LIGHT-TRANSMITTING AREA AND A LIGHT-OPAQUE AREA

CROSS-REFERENCE TO RELATED APPLICATION

This application claims the priority benefits of Taiwan application serial no. 106131667, filed on Sep. 15, 2017. The entirety of each of the above-mentioned patent applications is hereby incorporated by reference herein.

BACKGROUND

Technical Field

The disclosure relates to a light emitting device and a transparent electrode thereof.

Description of Related Art

The light emitting device is generally composed of electrode layers, a light emitting layer, a driving element and various wires (such as scanning lines, data lines, etc.). The electrode layer may be a transparent electrode for light transmission. A metal doping of different work functions (such as Mg:Ag) on the organic layer is used as the electron injection layer of a conventional transparent electrode, and the electron injection layer further combined with a metal of good electrical conductivity (such as Ag) is used as a transparent electrode.

The transparent light emitting device can be applied in life to enhance the convenience of information dissemination, such as smart windows, advertising billboards, car displays and other applications. It has become the focus of attention and development projects.

In order to pursue high transparency, it is necessary to introduce transparent electrodes with high transmittance into the light emitting device. However, the conventional metal-based transparent electrode will lead to lower transmittance, and affect the overall transparency of the light emitting device.

Another way to improve the transparency of the light emitting device is to make holes or perforations in the conventional metal-based transparent electrode. But this method will cause the problem of uneven brightness, also increase the resistance and reduce the conductivity, thereby affecting the luminous efficiency of the device.

SUMMARY

Embodiments of the disclosure provide a transparent electrode of a light emitting device for achieving high transparency and maintaining high conductivity.

Embodiments of the disclosure provide a light emitting device having the above mentioned transparent electrode.

According to an embodiment of the disclosure, a transparent electrode of light emitting device includes a transparent conducting layer and an injection layer. The injection layer is disposed between the transparent conducting layer and a light emitting layer of the light emitting device, wherein a material of the injection layer is a metal-doped alkali metal salt or a metal-doped metal oxide.

According to another embodiment of the disclosure, a light emitting device includes a first electrode, a light emitting layer and a second electrode. The light emitting layer is disposed between the first electrode and the second electrode, wherein at least one of the first electrode and the second electrode is a transparent electrode. The transparent electrode includes a transparent conducting layer and an injection layer disposed between the transparent conducting layer and the light emitting layer, wherein a material of the injection layer is a metal-doped alkali metal salt or a metal-doped metal oxide.

According to yet another embodiment of the disclosure, a transparent light emitting device having a light-transmitting area and a light-opaque area includes a first electrode and a plurality of stacking structures. The first electrode is disposed on a substrate; the plurality of stacking structures are disposed on the first electrode repeatedly, wherein each of the stacking structures comprises a light emitting layer, an injection layer and a transparent conducting layer that are stacked sequentially, and the light emitting layer in each stacking structures is disposed in the light-opaque area; wherein a material of the injection layer is a metal-doped alkali metal salt or a metal-doped metal oxide, the plurality of transparent electrodes extend to the light-transmitting area and the transmittance of the light-transmitting area is greater than 50%.

The foregoing will become better understood from a careful reading of a detailed description provided herein below with appropriate reference to the accompanying drawings.

DESCRIPTION OF THE EMBODIMENTS

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

Wording such as up, down, front, back, left and right mentioned in exemplary embodiments merely refers to the directions in the accompanying drawings without being limited to the exemplary embodiments set forth herein.

Figure 1:
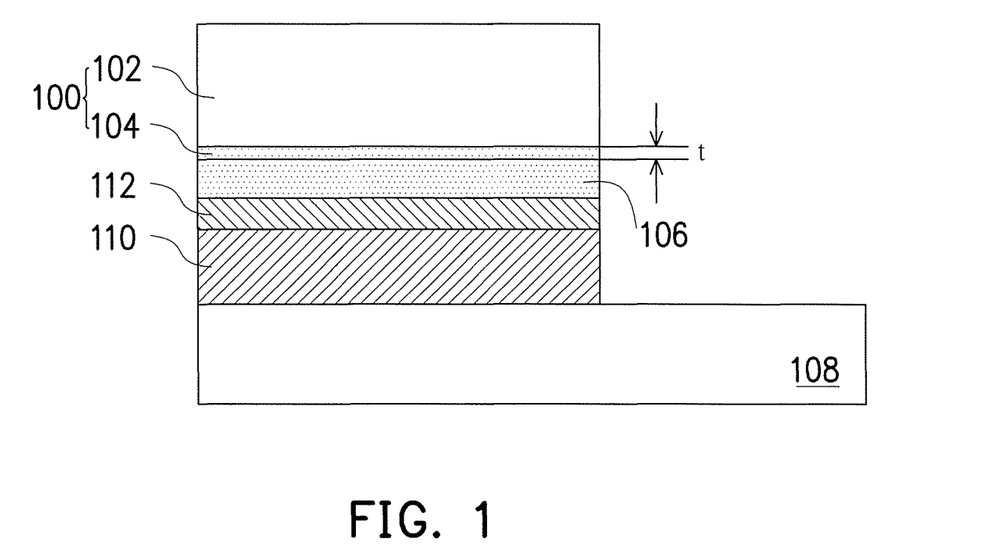
FIG. 1 is a cross-sectional view showing a light emitting device including a transparent electrode according to a first embodiment of the disclosure.

FIG. 1 is a cross-sectional view showing a light emitting device including a transparent electrode 100 according to a first embodiment of the disclosure.

In the first embodiment of the disclosure of FIG. 1, the transparent electrode 100 includes a transparent conducting layer 102 and an injection layer 104. The injection layer 104 is disposed between the transparent conducting layer 102 and a light emitting layer 106 of the light emitting device. The thickness t of the injection layer 104 is less than 15 nm (nanometer), for instance. For example, the thickness t is between 2~10 nm. In addition, the light emitting device generally further includes a driving element 110 disposed on a substrate 108 and another electrode 112 opposite to the transparent electrode 100. The driving element 110 may be an active driving element or a passive driving element 110, for example, the driving element 110 is a thin film transistor (TFT). The light emitting layer 106 is disposed between the electrode 112 and the transparent electrode 100, for instance, the electrode 112 is the anode and the transparent electrode 100 is the cathode. A material of the injection layer 104 is a metal-doped metal oxide or a metal-doped alkali metal salt. The metal oxide is, for instance, $LiO_2$ or $MoO_3$, but the scope of the disclosure is not limited thereto. The alkali metal salt is, for instance, LiF, $LiBO_3$, $K_2SiO_3$, $Cs_2CO_3$ or $CH_3COOM$ (M is Li, Na, K, Rb or Cs), but the scope of the disclosure is not limited thereto. The metal doped in the injection layer 104 is, for instance, Al, Ca, Ag, Cu, Mg, or an alloy thereof such as Mg:Ag or Li:Al, but the scope of the disclosure is not limited thereto. In this embodiment, the injection layer 104 can be made by a co-evaporation method. For example, different evaporation sources are used in a vacuum chamber for co-evaporation, so it is possible to simultaneously evaporate the metal oxide or alkali metal salt and the metal in an approximate weight or volume ratio, wherein the mixing weight ratio of the metal doped in the injection layer to the metal oxide or the alkali metal salt is, for example, between 1:1 and 1:5, but the scope of the disclosure is not limited thereto.

Figure 2:
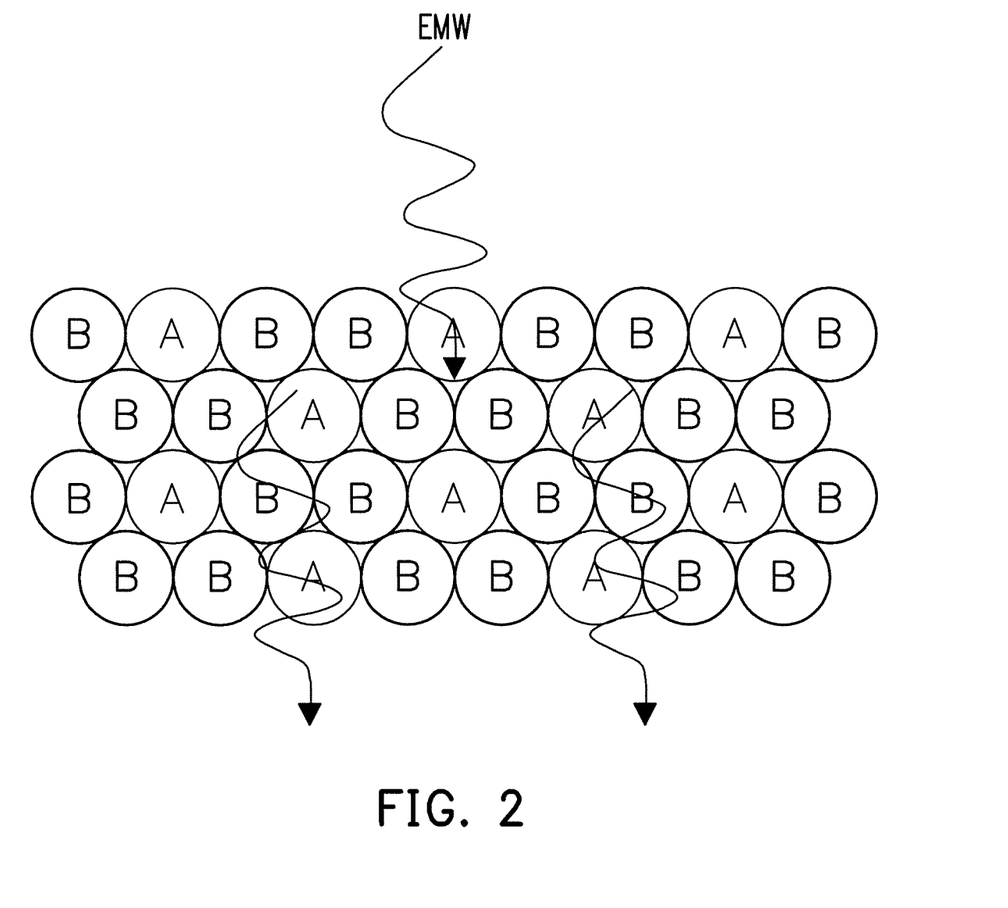
FIG. 2 is a schematic diagram showing a principle of the penetration of the injection layer shown in FIG. 1.

In the present embodiment, a metal-doped alkali metal salt is used as the injection layer 104 in the transparent electrode 100, so that a porous structure as shown in FIG. 2 is formed. In FIG. 2, the alkali metal salts are represented by circles with "A", the doped metal is represented by circles with "B". Because metals are added to alkali metal salts such as LiF, the equivalent dielectric constant of a composite film composed of the metal-doped alkali metal salt is changed, so that electromagnetic waves (EMW) can penetrate the composite film more easily without being absorbed. In another embodiment, the injection layer 104 may also include organic material. The organic material is mixed and distributed with the alkali metal salts and the doped metal. The organic material may be an organic material for the injection layer or an organic material for buffering, such as Liq, HAT-CN, CuPc, F4TCNQ, etc. Further, based on a total weight of the injection layer 104 of 100%, the content of the organic material is less than about 50%. If the injection layer 104 is produced by the co-evaporation method, the organic material can be added by increasing other evaporation sources.

In the first embodiment, the transparent conducting layer 102 is, for instance, transparent metal oxide. The transparent metal oxide is, for instance, ITO, IZO, AZO, ZnO, FTP or GZO, so that, after the transparent metal oxide is combined with the injection layer 104, not only the overall transmittance of the electrode is increased but also a high conductivity of the electrode is maintained. The electrode 112 may be a general metal electrode for a light emitting device, but the scope of the disclosure is not limited thereto. In another embodiment, the electrode 112 may be the same structure as the transparent electrode 100, and the injection layer 104 is disposed between the transparent conducting layer 102 and the light emitting layer 106.

Figure 3:
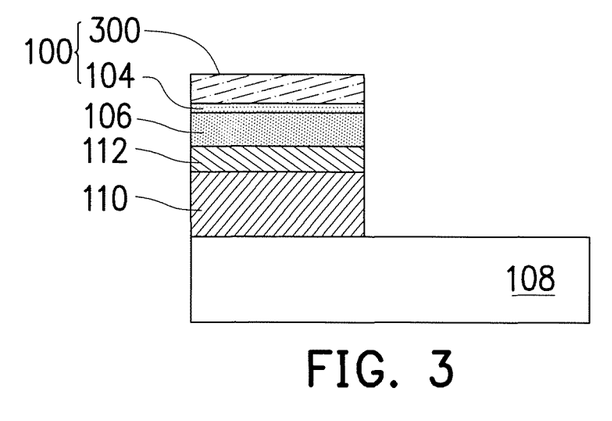
FIG. 3 is another schematic diagram showing the light emitting device according to the first embodiment of the disclosure.

FIG. 3 is another schematic diagram showing the light emitting device according to the first embodiment, wherein the same reference numerals as in FIG. 1 are used to represent the same elements, and thus descriptions of repeated technical contents will be omitted.

In FIG. 3, the transparent conducting layer in the transparent electrode 100 is a metal thin film 300, and the remaining elements are the same as those in FIG. 1. The transmittance of the metal thin film 300 is 50% or more, so after the metal thin film 300 is combined with the injection layer 104, the overall transmittance of the electrode can be ensured and the electrode has a high conductivity. The material of the metal film 300 is, for instance, silver or aluminum.

Figure 4:
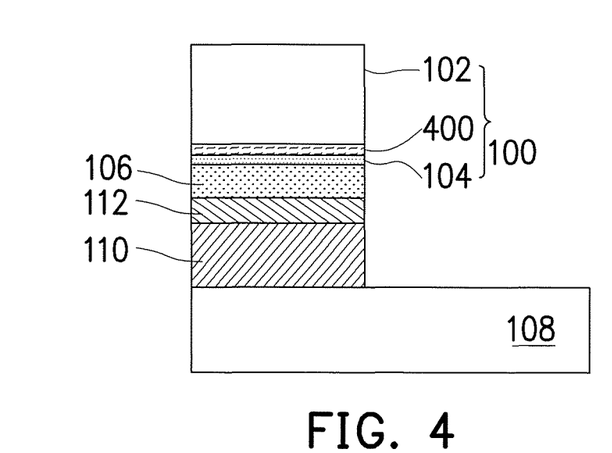
FIG. 4 is yet another schematic diagram showing the light emitting device according to the first embodiment of the disclosure.

FIG. 4 is yet another schematic diagram showing the light emitting device according to the first embodiment of the disclosure, wherein the same reference numerals as in FIG. 1 are used to represent the same elements, and thus descriptions of repeated technical contents are omitted herein.

In FIG. 4, the transparent electrode 100 also includes a buffer layer 400 between the transparent conducting layer 102 and the injection layer 104, and the remaining elements are the same as those of FIG. 1. The buffer layer 400 may be used to protect the underlying light emitting layer 106 from the influences of subsequent processes. For example, the transparent conducting layer 102 is generally formed by sputtering so that the sputtering process may damage the surface of the light emitting layer 106, therefore, the buffer layer 400 may be formed first on the surface of the injection layer 104 and then subjected to a subsequent sputtering process. In addition, if the buffer layer 400 is HAT-CN (Hexaazatriphenylenehexacarbonitrile), it may have a plane effect because of the structure of the material itself.

Figure 5:
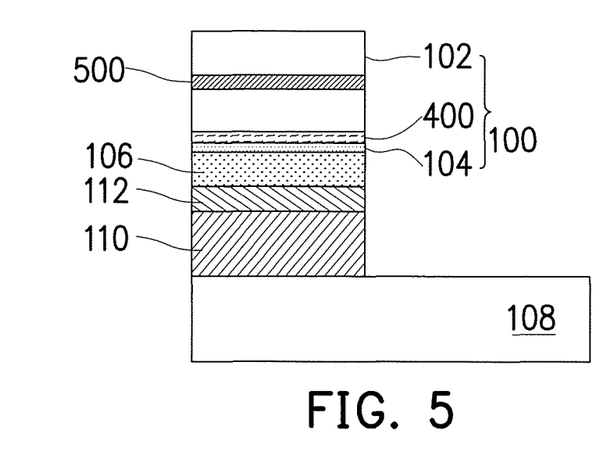
FIG. 5 is yet another schematic diagram showing the light emitting device according to the first embodiment of the disclosure.

FIG. 5 is yet another schematic diagram showing the light emitting device according to the first embodiment of the disclosure, wherein the same reference numerals as in FIG. 4 are used to represent the same elements, and thus descriptions of repeated technical contents will be omitted.

In FIG. 5, the transparent electrode 100 also includes a metal thin film 500 in the transparent conducting layer 102 and the transmittance of the metal thin film 500 is 50% or more, the remaining elements are the same as those of FIG. 4. The metal thin film 500 may increase the conductivity and maintain a high transmittance. The material of the metal film 500 is, for instance, silver or aluminum. In addition, the buffer layer 400 in FIG. 5 may be omitted depending on the structure design.

Figure 6:
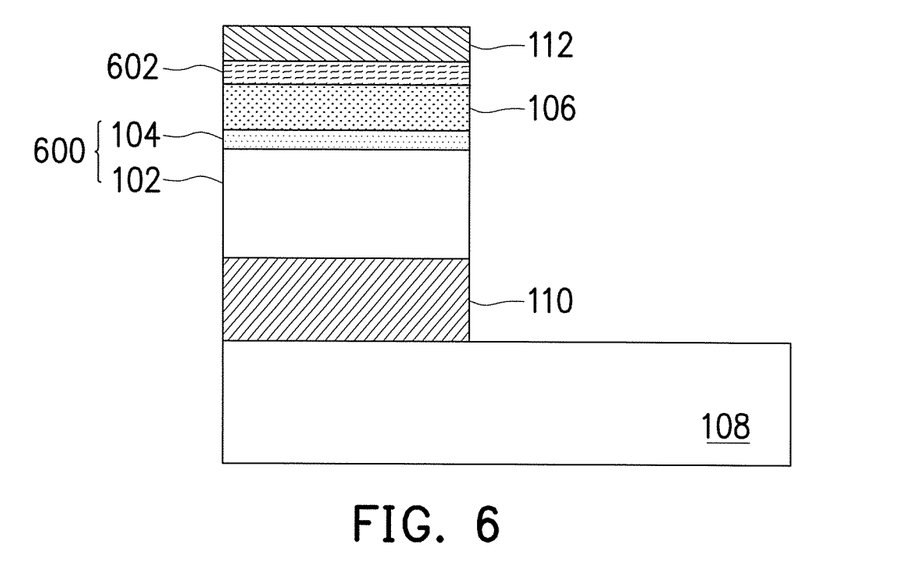
FIG. 6 is a schematic diagram showing a light emitting device according to a second embodiment of the disclosure.

FIG. 6 is a schematic diagram showing a light emitting device according to a second embodiment of the disclosure, wherein the same reference numerals as in FIG. 1 are used to represent the same elements.

Please refer to FIG. 6, a transparent electrode 600 of the second embodiment includes the transparent conducting layer 102 and the injection layer 104. The difference between the first embodiment and the second embodiment is that the light emitting device of the second embodiment is an inverted type structure. Therefore, the transparent electrodes 600 is disposed between the light emitting layer 106 of the light emitting device and the substrate 108, and the other electrode 112 is disposed on the light emitting layer 106, the electrode 112 may be an anode and the transparent electrode 600 may be a cathode. The driving element 110 is disposed between the transparent electrode 600 and the substrate 108. In addition, a buffer layer 602 may be selectively provided between the light emitting layer 106 and the electrode 112 to protect the light emitting layer 106 under the buffer layer 602 from the influences of subsequent processes. For instance, the buffer layer 400 is HAT-CN or other suitable materials. The descriptions of repeated technical contents may refer to the descriptions in FIG. 1 and thus will be omitted herein.

Figure 7:
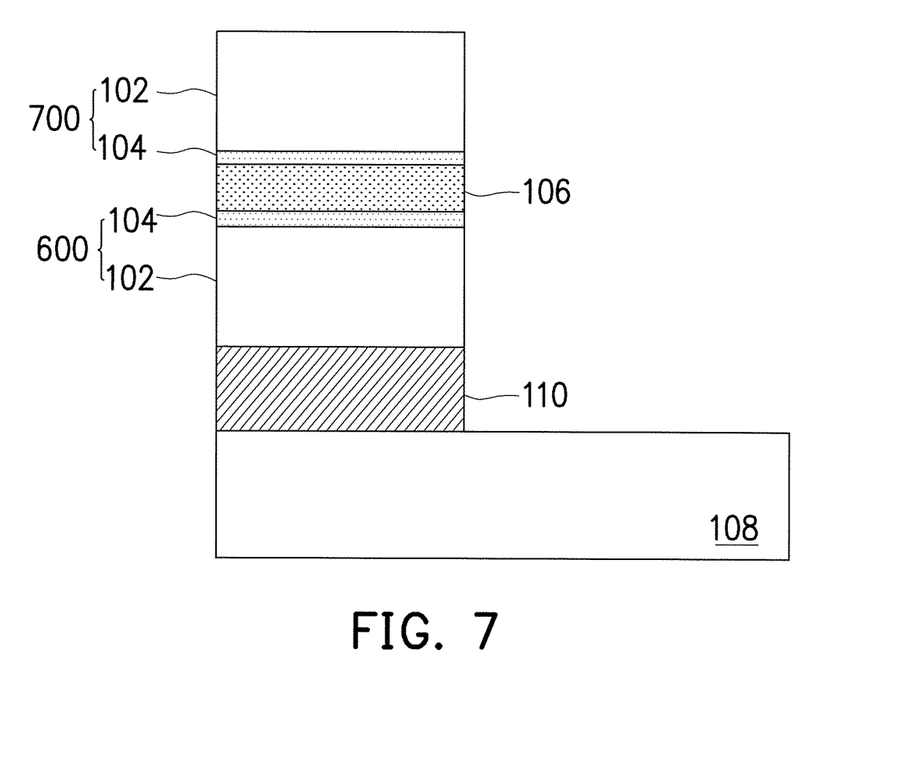
FIG. 7 is a schematic diagram showing a light emitting device according to a third embodiment of the disclosure.

FIG. 7 is a schematic diagram showing a light emitting device according to third embodiment of the disclosure, wherein the same reference numerals as the second embodiment are used to represent the same elements.

Please refer to FIG. 7, the difference between the third embodiment and the second embodiment is that the electrode disposed on the light emitting layer 106 is a transparent electrode 700. The transparent electrode 700 includes the transparent conducting layer 102 and the injection layer 104, and the injection layer 104 is disposed between the transparent conducting layer 102 and the light emitting layer 106. This third embodiment does not show a selectively disposed buffer layer as compared with the second embodiment. Thus, the overall transmittance of the light emitting device of the third embodiment is further increased. The descriptions of repeated technical contents may refer to the above-mentioned embodiments and thus will be omitted herein.

Figure 8:
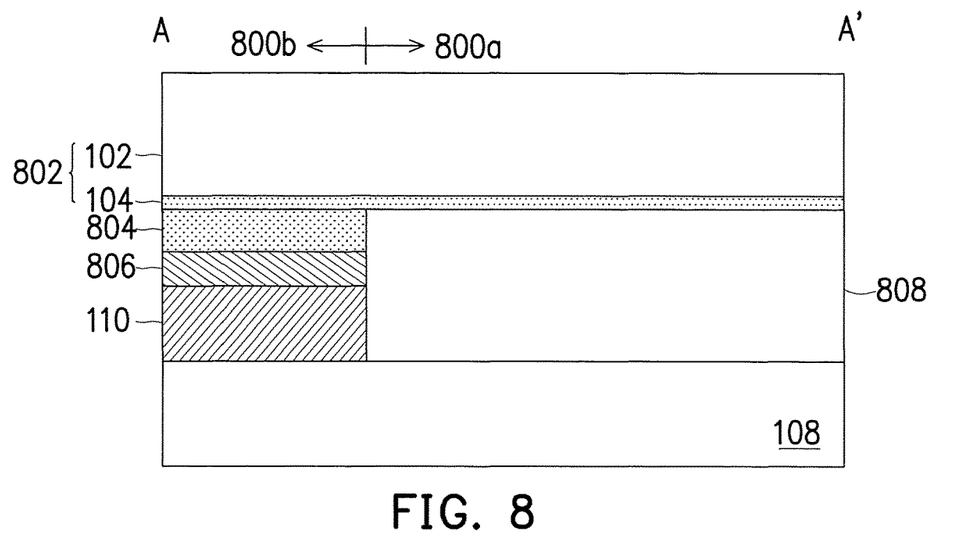
FIG. 8 is a schematic diagram showing a light emitting device according to a fourth embodiment of the disclosure.

FIG. 8 is a schematic diagram showing a light emitting device according to a fourth embodiment of the disclosure, wherein the same reference numerals as the first embodiment are used to represent the same elements In FIG. 8, the light emitting device has a light-transmitting region 800a and a light-opaque region 800b, wherein the light-transmitting region 800a is a region with the transmittance much greater than that of the light-opaque region 800b. The light emitting device in FIG. 8 includes a first electrode 802, a light emitting layer 804 and a second electrode 806, the light emitting layer 804 is disposed between the first electrode 802 and the second electrode 806 in the light-opaque region 800b. The first electrode 802 is a transparent electrode and the transparent electrode extends to the light-transmitting region 800a, and the transmittance of the light-transmitting region 800a is 50% or more. In this embodiment, the light-transmitting region 800a is entirely covered with the first electrode 802 (transparent electrode), so that not only the overall transmittance of the electrode can be enhanced, but also the uneven brightness and the increase of the resistance due to making holes or perforations in the electrodes in the conventional method for improving transmittance can be improved while the luminous efficiency of the device is maintained. The first electrode 802 (transparent electrode) may be designed to cover the light-transmitting region 800a partially as desired. In the present embodiment, except that the driving element 110, wires such as scanning lines (not shown) and data lines (not shown) may also be included in the light-opaque region 800b. The light-transmitting region 800a may have a transparent material 808 filled between the substrate 108 and the first electrode 802.

Figure 9:
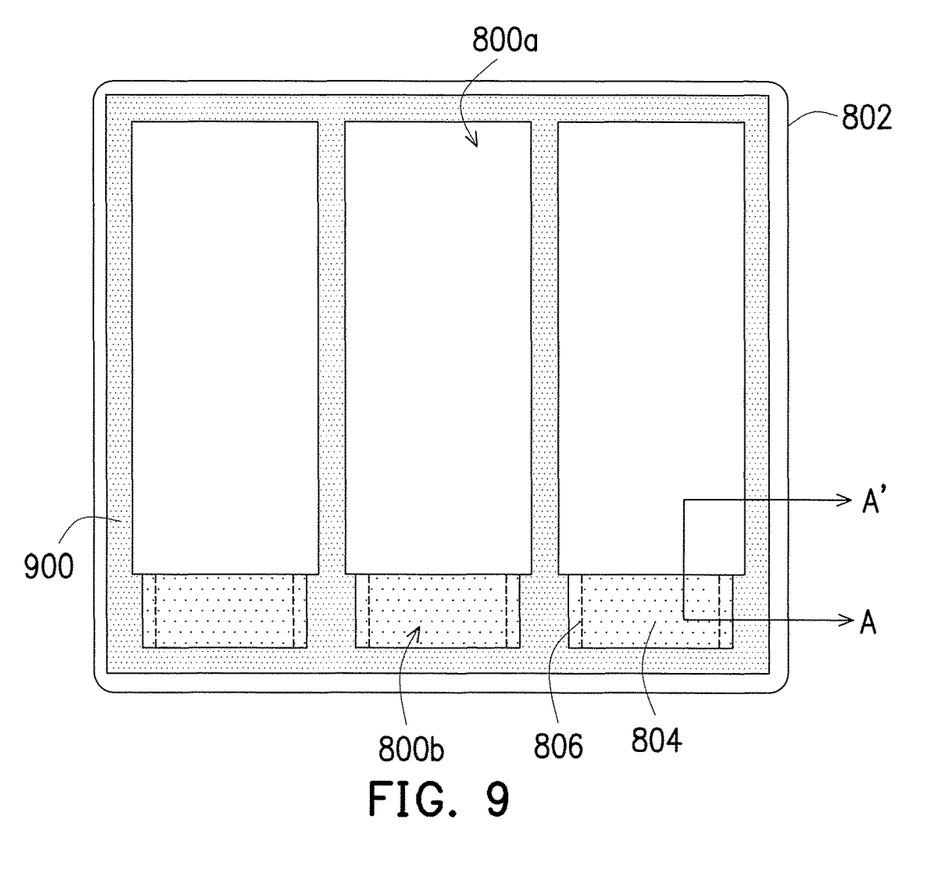
FIG. 9 is a top view showing the light emitting device of FIG. 8.

FIG. 9 is a top view showing the light emitting device of FIG. 8. Please refer to FIG. 9, the position relationship between the light-transmitting region 800a and the light-opaque region 800b is shown. The light-transmitting region 800a is generally a region defined by a Pixel Define Layer (PDL) 900, and the light-opaque region 800b basically comprises the second electrode 806, which may be an anode. In FIG. 9, the first electrode 802 (transparent electrode) is disposed in the light-opaque region 800b and also covers the entire light-transmitting region 800a and the PDL 900 in addition to the light-opaque region 800b.

Figure 10:
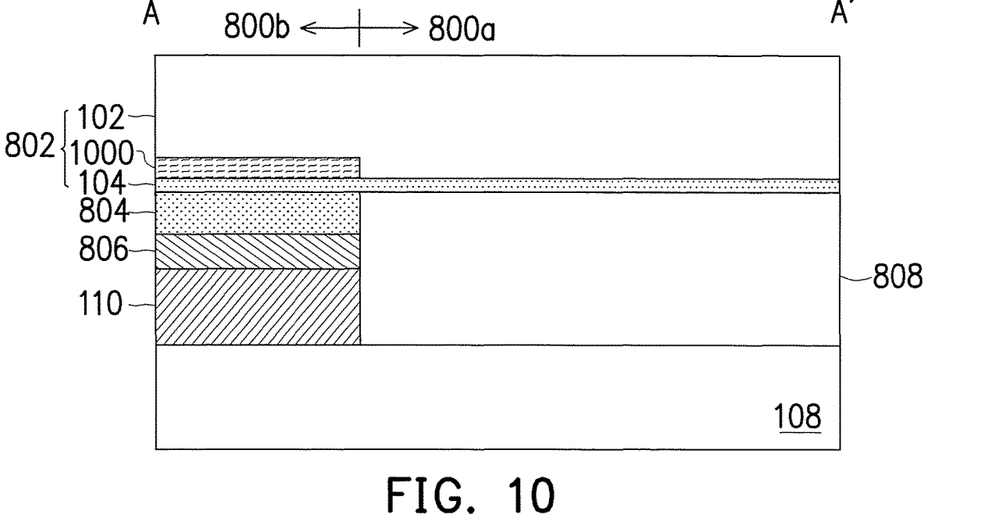
FIG. 10 is another schematic diagram showing the light emitting device according to the fourth embodiment of the disclosure.

FIG. 10 is another schematic diagram showing the light emitting device according to the fourth embodiment of the disclosure, wherein the same reference numerals as in FIG. 8 are used to represent the same elements, and thus descriptions of repeated technical contents will be omitted.

In FIG. 10, the first electrode 802 also includes a buffer layer 1000, the buffer layer 1000 is disposed between the transparent conducting layer 102 in the light-transmitting region 800a and the inject layer 104, and the remaining elements are the same as those in FIG. 8. The buffer layer 1000 may be used to protect the light emitting layer 804 under the buffer layer 1000 from the influences of subsequent processes. The buffer layer 1000 may also have a plane effect as described in FIG. 4.

Here are a few experiments to verify the efficacy of the present disclosure, but the experimental contents are not intended to limit the scope of the disclosure.

⟨Experimental Example 1⟩

First, a silicon nitride layer is deposited on a glass substrate, the thickness of the silicon nitride layer is 100 nm. After that, an Al-doped LiF layer is formed by co-evaporation, wherein the mixing weight ratio of Al:LiF is 3:2, then an IZO layer is sputtered to complete a transparent electrode to be tested. The thickness of the Al-doped LiF layer is 10 nm, and the thickness of the IZO is 280 nm.

The resistivity and the transmittance of the above-mentioned transparent electrode are measured, and the results are shown in Table 1 below.

⟨Experimental Example 2⟩

A transparent electrode is prepared in the same manner as in experimental example 1 except that the mixing weight ratio of Al:LiF is changed to 1:1.

The resistivity and the transmittance of the above-mentioned transparent electrode are measured, and the results are shown in Table 1 below.

⟨Experimental Example 3⟩

A transparent electrode is prepared in the same manner as in experimental example 1 except that the mixing weight ratio of Al:LiF is changed to 2:3.

The resistivity and the transmittance of the above-mentioned transparent electrode are measured, and the results are shown in Table 1 below and FIG. 11.

⟨Comparative Example 1⟩

A transparent electrode is prepared in the same manner as in experimental example 1 except that Al-doped LiF is replaced by pure aluminum (Al).

The resistivity and the transmittance of the above-mentioned transparent electrode are measured, and the results are shown in Table 1 below.

⟨Comparative Example 2⟩

A transparent electrode is prepared in the same manner as in experimental example 1 except that Al-doped LiF is replaced by LiF.

The resistivity and the transmittance of the above-mentioned transparent electrode are measured, and the results are shown in Table 1 below.

TABLE 1

|  | comparative example 1 | experimental example 1 | experimental example 2 | experimental example 3 | comparative example 2 |
|---|---|---|---|---|---|
| resistivity (Ohm/square) | 30.8 | 27.9 | 27.6 | 27.6 | 784K |
| transmittance (%)@550 nm | 52.3 | 68.5 | 89.8 | 89.8 | 87.9 |

As shown in Table 1, in the examples for using LiF or Al layer, the resistance of the IZO is higher in the sputtering process. In contrast, the examples for using Al-doped LiF film show the lower resistance, and thus such a co-evaporated film has the effect of stabilizing the formation of IZO. Moreover, when the mixing weight ratio of Al:LiF is 1:1 or less, the overall transmittance increases from 52% to about 90% at the wavelength of 550 nm.

⟨Comparative Example 3⟩

A transparent electrode is prepared in the same manner as in experimental example 3 except that Al-doped LiF is changed to a four-layer structure in which a single layer of LiF (3 nm) and a single layer of Al (2 nm) are respectively evaporated and alternately stacked, and the total thickness of the four-layer structure is 10 nm.

Figure 11:
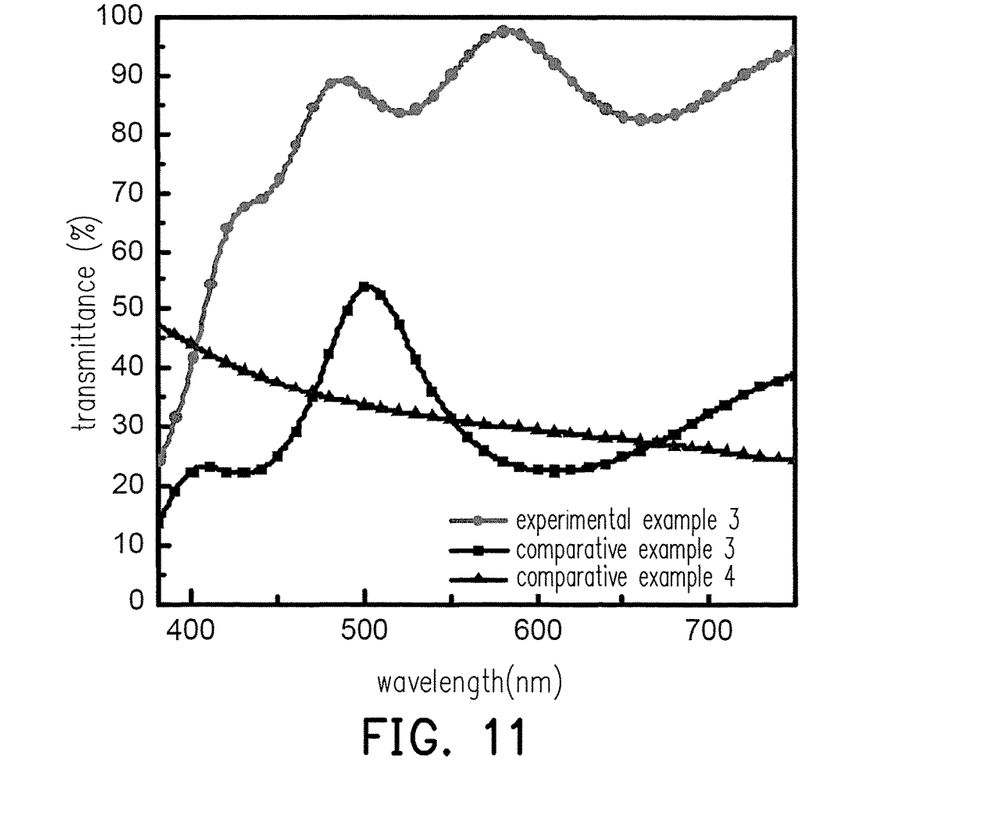
FIG. 11 is a transmittance diagram of experimental example 3 and comparative examples 3 and 4.

The transmittance of the above-mentioned transparent electrode is measured, and the result is shown in FIG. 11. In FIG. 11, the horizontal axis represents the wavelength and the wavelength unit is nanometer. The vertical axis represents the transmittance T and the transmittance unit is %.

⟨Comparative Example 4⟩

A transparent electrode is prepared in the same manner as in experimental example 3 except that Al-doped LiF is changed to a two-layer structure in which a single layer of LiF (6 nm) and a single layer of Al (4 nm) are respectively evaporated and stacked, and the total thickness of the two-layer structure is 10 nm.

The transmittance of the above-mentioned transparent electrode is measured, and the result is shown in FIG. 11.

As shown in FIG. 11, the transparent electrode of Experimental Example 3 has a higher transmittance than the transparent electrode by stacking the LiF layer and the Al layer of Comparative Example 3 and Comparative Example 4.

⟨Experimental Example 4⟩

First, an ITO of 100 nm thickness is deposited as an electrode (anode) on a glass substrate, and then an organic hole transport layer and Ir $(ppy)_3$ are formed as a light emitting layer. After the formation of the electron transport layer, an Al-doped LiF of 5 nm thickness is formed by co-evaporation in which the mixing weight ratio of Al:LiF is 2:3, then an IZO layer of 280 nm thickness is sputtered to form a transparent electrode (cathode) containing Al-doped LiF and IZO in order to complete a light emitting device to be tested.

The above-mentioned light emitting device is first simulated to obtain its current efficiency and transmittance, and then the optical properties and the electrical properties of both the top luminescence and the bottom luminescence are measured, and the results are shown in Table 2 below and FIG. 12 and FIG. 13.

⟨Experimental Example 5⟩

A light emitting device is prepared in the same manner as in experimental example 4 except that the thickness of Al-doped LiF is changed to 10 nm.

The above-mentioned light emitting device is first simulated to obtain its current efficiency and transmittance, and then the optical properties and the electrical properties of both the top luminescence and the bottom luminescence are measured, and the results are shown in Table 2 below and FIG. 12 and FIG. 13.

⟨Comparative Example 5⟩

A light emitting device is prepared in the same manner as in experimental example 4 except that the transparent electrode is replaced by a stacking structure of Mg:Ag (5 nm) and Ag (15 nm).

The above-mentioned light emitting device is first simulated to obtain its current efficiency and transmittance, and then the optical properties and the electrical properties of the bottom luminescence are measured, and the results are shown in Table 2 below.

TABLE 2

|  | experimental example 4 | experimental example 5 | comparative example 5 |
|---|---|---|---|
| simulated total efficiency (positive energy any unit) | 0.0822 | 0.0436 (0.53X) | 0.0441 (0.54X) |
| measured total efficiency | 40 cd/A | 16.05 cd/A (0.40X) | 15.9 cd/A (0.40X) |
| transmittance T % (simulation/measurement) | 0%/0% | 68.30%/76.56% | 68.14%/71.7% |

As shown in Table 2, the efficiencies of experimental examples 4 and 5 are lower, but the transmittance is increased greatly. The ratios of the simulated total efficiency of experimental example 5 and comparative example 5 to the simulated total efficiency of 0.0822 of experimental example 4 are 0.53 and 0.54, respectively. The ratios of the simulated total efficiency in experimental example 5 and comparative example 5 to the simulated total efficiency of experimental example 4 are indicated by (0.53×) and (0.54×) in Table 2, respectively. In addition, the ratios of the measured total efficiency of experimental example 5 and comparative example 5 to the measured total efficiency of 40 cd/A of experimental example 4 are 0.40 and 0.40, respectively. The ratios of the measured total efficiency in experimental example 5 and comparative example 5 to the simulated total efficiency of experimental example 4 are indicated by (0.40×) and (0.40×) in Table 2.

Figure 12:
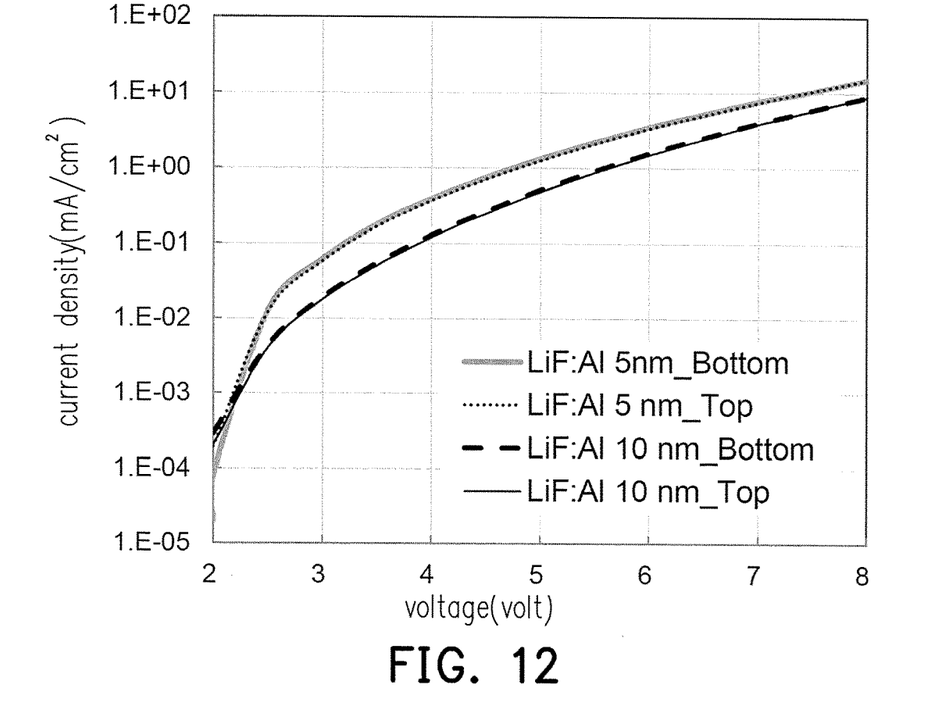
FIG. 12 is a relation diagram of current density and operation voltage of experimental examples 4 and 5.
Figure 13:
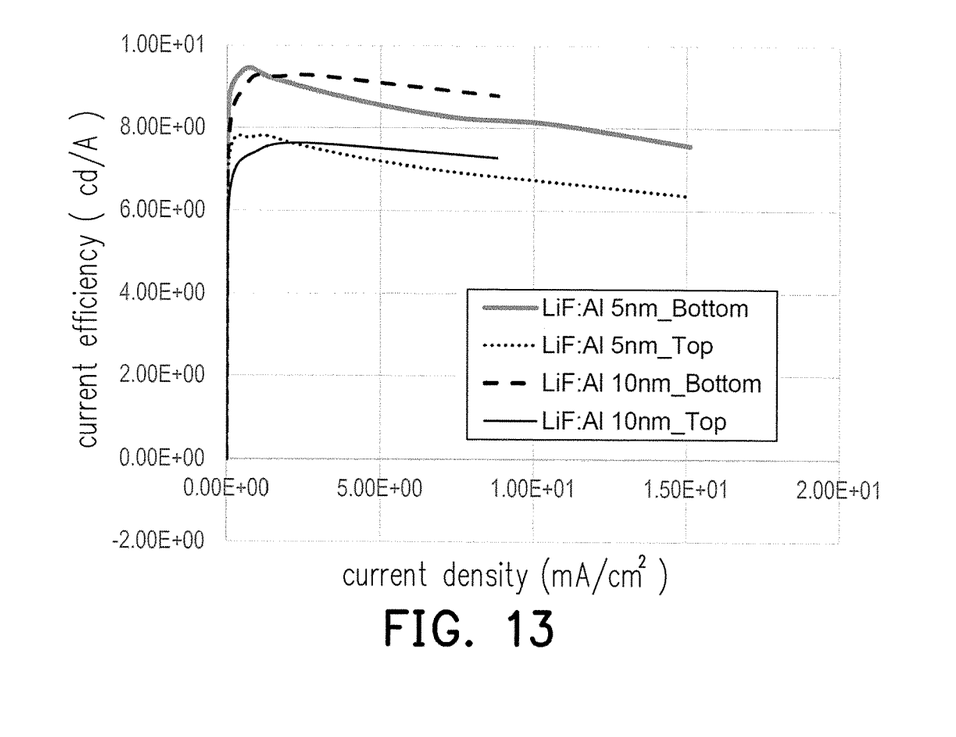
FIG. 13 is a relation diagram of current efficiency and current density of experimental examples 4 and 5.

FIG. 12 is a relation diagram of current density versus operation voltage of experimental example 4 (the thickness of the Al-doped LiF is 5 nm) and experimental example 5 (the thickness of the Al-doped LiF is 10 nm). In FIG. 12, "bottom" refers to that the light is emitted from the light emitting layer toward the substrate, "top" refers to that the light is emitted from the light emitting layer toward the cathode. The horizontal axis represents voltage and the unit is volt. The vertical axis represents current density and the unit is mA/cm$^2$. FIG. 13 is a relation diagram of current efficiency versus current density of experimental example 4 (the thickness of the Al-doped LiF is 5 nm) and experimental example 5 (the thickness of the Al-doped LiF is 10 nm). In FIG. 13, "bottom" refers to that the light is emitted from the light emitting layer toward the substrate, "top" refers to that the light is emitted from the light emitting layer toward the cathode. The horizontal axis current density and the unit is mA/cm$^2$. The vertical axis represents current efficiency and the unit is cd/A. It may be seen from FIG. 12 and FIG. 13, the Al-doped LiF with a thinner thickness has a better injection capability.

〈Experimental Example 6〉

First, a TFT (thin film transistor) is formed on a glass substrate. Then an ITO of 100 nm thickness is deposited as an electrode (anode), and then an organic hole transport layer and Ir (ppy)$_3$ are formed as a light emitting layer. After the formation of the electron transport layer, an Al-doped LiF of 5 nm thickness is formed by co-evaporation in which the mixing weight ratio of Al:LiF is 2:3, then an IZO layer of 280 nm thickness is sputtered to form a transparent electrode (cathode) with Al-doped LiF and IZO in order to complete a light emitting device to be tested.

Figure 14:
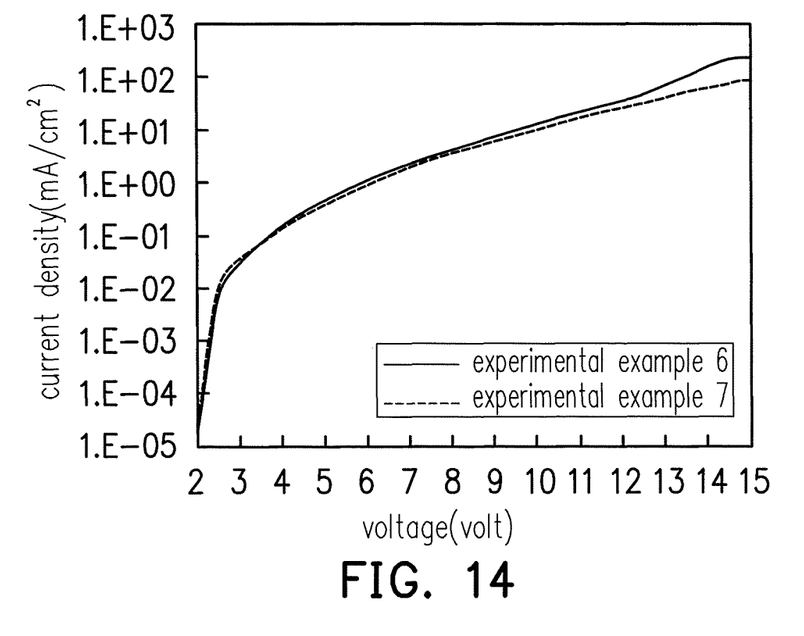
FIG. 14 is a relation diagram of current density and operation voltage of experimental examples 6 and 7.
Figure 15:
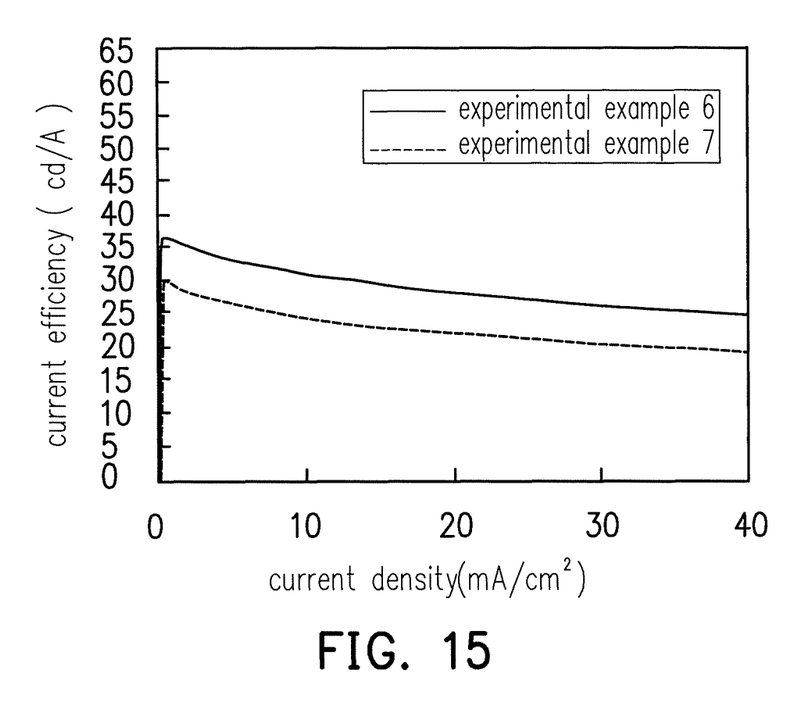
FIG. 15 is a relation diagram of current efficiency and current density of experimental examples 6 and 7.

The electrical properties of the above-mentioned light emitting device are measured, and the results are shown in FIG. 14 and FIG. 15.

〈Experimental Example 7〉

A light emitting device is prepared in the same manner as in experimental example 6, but the light emitting device further includes an HAT-CN of 20 nm thickness disposed between Al-doped LiF and IZO as a buffer layer.

The electrical properties of the above-mentioned light emitting device are measured, and the results are shown in FIG. 14 and FIG. 15.

FIG. 14 is a relation diagram of current density versus operation voltage of experimental examples 6 and 7. FIG. 15 is a relation diagram of current efficiency versus current density of experimental examples 6 and 7. As shown in FIG. 14, the current density of the light emitting devices of experimental examples 6 and 7 are substantially the same while the operating voltage changes. From FIG. 15, it also can be observed that the efficiency of experimental example 6 without a buffer layer is higher than that of experimental example 7 with a buffer layer, therefore, Al-doped LiF itself has the effect of protecting the light emitting layer from the damage by the sputtering process.

Figure 16:
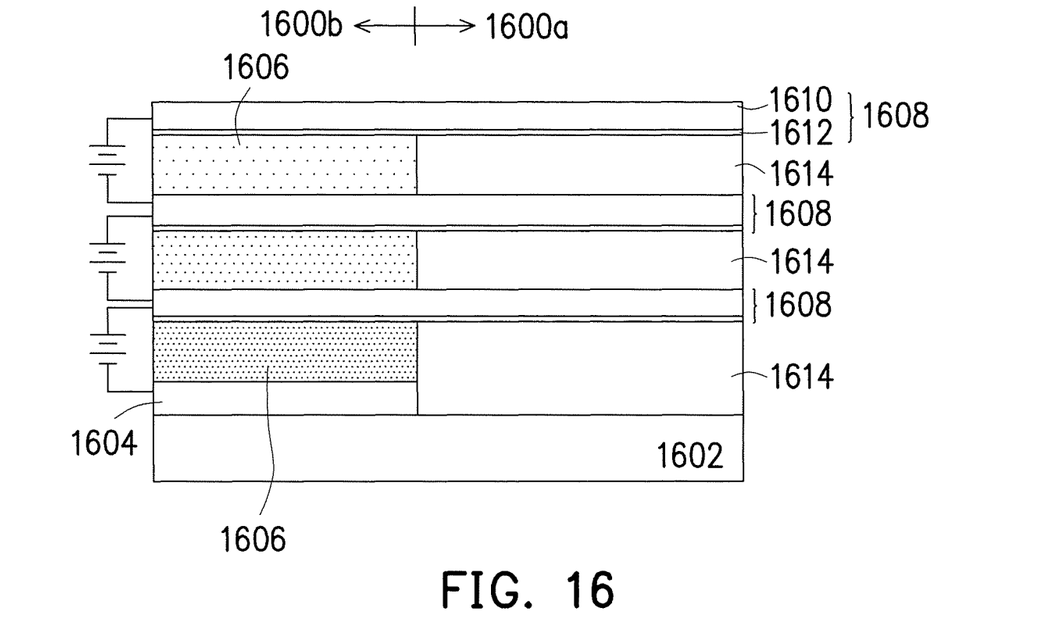
FIG. 16 is a schematic diagram showing a transparent light emitting device according to a fifth embodiment of the disclosure.

FIG. 16 is a schematic diagram showing a transparent light emitting device according to a fifth embodiment of the disclosure.

In FIG. 16, a transparent light emitting device having the light-transmitting area and the light-opaque area, wherein the light-transmitting region 800a is a region where the transmittance is much greater than that of the light-opaque region 800b. The transparent light emitting device includes a first electrode 1604, a plurality of light emitting layers 1606 and a plurality of second electrodes 1608, wherein the first electrode 1604 is disposed on a substrate 1602, and the plurality of light emitting layers 1606 and the plurality of the second electrodes 1608 are alternately stacked on the first electrode 1604. The plurality of light emitting layers 1606 are disposed in the light-opaque area 1600b, and the plurality of light emitting layers 1606 may emit their respective lights. Therefore, the luminous intensity of each light emitting layer 1606 can be modulated by adjusting the DC (direct current) offset potential between the second electrodes 1608. Then the color of the light emitted from the transparent light emitting device can be modulated. The second electrode 1608 is the transparent electrode as mentioned in the aforesaid embodiments, and extends to the light-transmitting region 1600a to have the transmittance of the light-transmitting region 1600a being equal to or greater than 50%.

The second electrode 1608 includes a transparent conducting layer 1610 and an injection layer 1612. In other word, a plurality of stacking structures is disposed on the first electrode 1604 repeatedly, wherein each of the stacking structures comprises a light emitting layer 1606, an injection layer 1612 and a transparent conducting layer 1610 that are stacked sequentially, and the light emitting layer 1606 in each stacking structures is disposed in the light-opaque area 1600b. The details of the second electrode 1608 and the injection layer 1612 may refer to the aforesaid embodiments, and are omitted herein.

In this embodiment, the light-transmitting region 1600a is entirely covered with the second electrode 1608 (transparent electrode), so that not only the overall transmittance of the electrode can be enhanced, but also the uneven brightness and the increase of the resistance due to making holes or perforations in the electrodes in the conventional method for improving transmittance can be improved while the luminous efficiency of the device is maintained. The second electrode 1608 (transparent electrode) may also be designed to cover the light-transmitting region 1600a partially as desired. In the present embodiment, the driving element (not shown), scanning lines (not shown) and data lines (not shown) may also be included in the light-opaque region 1600b. The light-transmitting region 1600a may have a transparent material 1614 filled between the substrate 1602 and the second electrodes 1608, and the transparent material 1614 is also filled between every two of second electrodes 1608.

Figure 17:
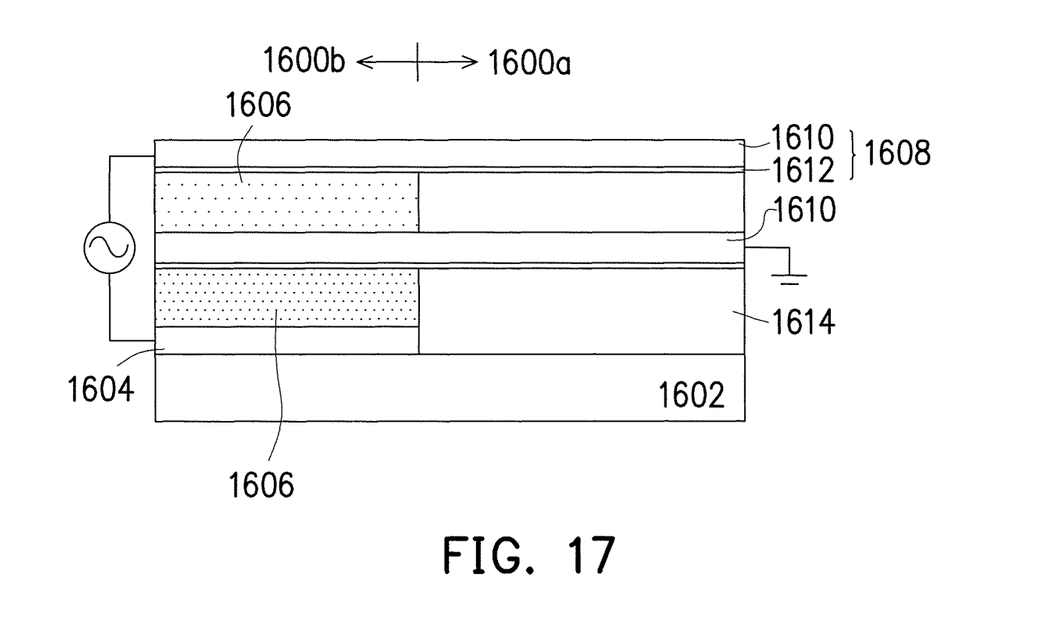
FIG. 17 is a schematic diagram showing a transparent light emitting device according to a sixth embodiment of the disclosure.

FIG. 17 is a schematic diagram showing a transparent light emitting device according to a sixth embodiment of the disclosure, wherein the same reference numerals as in FIG. 16 are used to represent the same elements, and thus descriptions of repeated technical contents are omitted.

In FIG. 17, the transparent light emitting device also includes a first electrode 1604, a plurality of light emitting layers 1606, and a plurality of second electrodes 1608. Since the plurality of light emitting layers 1606 can emit their respective lights, so the color of the emitted light of the transparent light emitting device can be modulated by the clock of the alternating current.

In summary, according to the embodiments of the present disclosure, a transparent electrode with metal-doped alkali salt or metal oxide and a transparent conducting layer is provided. The overall transmittance of the electrode is enhanced and a high conductivity is maintained without a complicated process or structural design. The transparent electrode also can be widely used in transparent products to enhance the transmittance and increase the luminous efficiency of the transparent products.

It will be apparent to those skilled in the art that various modifications and variations can be made to the disclosed embodiments without departing from the scope or spirit of the disclosure. It is intended that the specification and examples be considered as exemplars only, with a true scape of the disclosure being indicated by the following claims and their equivalents.

What is claimed is:

1. A light emitting device, comprising:
   a first electrode;
   a second electrode; and
   a light emitting layer disposed between the first electrode and the second electrode; wherein at least one of the first electrode and the second electrode is a transparent electrode, and the transparent electrode comprising:
   a transparent conducting layer; and
   an injection layer disposed between the transparent conducting layer and the light emitting layer, wherein a material of the injection layer is an alkali metal salt doped with a pure metal or an alloy thereof,
   wherein the light emitting device having a light-transmitting area and a light-opaque area, the light emitting layer is disposed between first electrode and the second electrode in the light-opaque region, the transparent electrode is extended to the light-transmitting area, and a transmittance of the light-transmitting area is greater than 50%.

2. The light emitting device according to claim 1, wherein the light-transmitting region is entirely covered with the transparent electrode.

3. The light emitting device according to claim 1, further including at least one driving element, a plurality of scanning lines and a plurality of data lines in the light-opaque region.

4. A transparent light emitting device having a light-transmitting area and a light-opaque area, comprising:
   a first electrode disposed on a substrate; and
   a plurality of stacking structures disposed on the first electrode repeatedly, wherein each of the stacking structures comprises a light emitting layer, an injection layer and a transparent electrode that are stacked sequentially, the light emitting layer in each stacking structures is disposed in the light-opaque area; wherein a material of the injection layer is a metal-doped alkali metal salt or a metal-doped metal oxide, the transparent electrode extends to the light-transmitting area and a transmittance of the light-transmitting area is greater than 50%.

5. The transparent light emitting device according to claim 4, wherein the light-transmitting region is entirely covered with the transparent electrode.

6. The transparent light emitting device according to claim 4, further including at least one driving element, a plurality of scanning lines and a plurality of data lines in the light-opaque region.

* * * * *